July 23, 1974 G. E. MOORE 3,825,442

METHOD OF A SEMICONDUCTOR DEVICE WHEREIN FILM CRACKING IS PREVENTED BY FORMATION OF A GLASS LAYER

Original Filed Jan. 22, 1970

GORDON E. MOORE
INVENTOR.

BY Spensley & Horn
ATTORNEYS

United States Patent Office 3,825,442
Patented July 23, 1974

3,825,442

METHOD OF A SEMICONDUCTOR DEVICE WHEREIN FILM CRACKING IS PREVENTED BY FORMATION OF A GLASS LAYER

Gordon E. Moore, Los Altos Hills, Calif., assignor to Intel Corporation, Santa Clara, Calif.

Continuation of abandoned application Ser. No. 4,841, Jan. 22, 1970. This application Sept. 27, 1972, Ser. No. 292,510
Int. Cl. H01l 7/34
U.S. Cl. 117—212 19 Claims

ABSTRACT OF THE DISCLOSURE

In the manufacture of a semiconductor device wherein a film is to be formed over portions of a first layer having abrupt surface contours, the improvement of forming a glass layer, having a melting point lower than that of said first layer, on the first layer and heating sufficiently to cause a plastic flow of the glass layer at the abrupt contour to round the edges and avoid cracking of the subsequently established film.

This is a continuation of application Ser. No. 4,841, filed Jan. 22, 1970, now abandoned.

BACKGROUND OF THE INVENTION

(1) Field of the Invention

This invention relates to the field of semiconductor devices such as integrated circuits.

(2) Prior Art

In the manufacture of miniature electronic devices such as semiconductor integrated circuits, it is frequently desired to establish electrical interconnections between two parts of the device by means of a conductive film making contact to the parts to be interconnected. Typically, this conducting film has a portion that overlies an insulating film and makes contact through small apertures in the insulator (e.g. silicon dioxide) to the underlying device portion (e.g. silicon). In addition, it is often desirable that this conducting film cross other films, which might be conducting, insulating or semiconducting. To accomplish this, conductive film (e.g. aluminum) is vacuum evaporated or otherwise deposited atop the device structure and photoengraved to leave a desired pattern of conductors.

The sequential film-forming and photoengraving processes utilized to construct the underlying device structure generally result in the occurrence of variations of height, comparable to the thicknesses of the films involved. Certain of these changes in surface elevation can have very steep, or even overhanging edges. These edges act as stress-concentrating regions and can result in occurrence of cracks in the conducting film that must traverse them. Such cracks are extremely deleterious. They can cause low production yield and can result in products that have high rates of failure in use.

Generally in the prior art, an attempt to minimize the occurrence of such cracks has involved an attempt to minimize the height of such steps by variation of the thickness of the several films or by making transitions through several levels of terraces, or an attempt to obtain gradual slopes through etching procedures. Both terracing and etch-sloping consume significant area in the structure, which is costly. Often the thicknesses of film required for acceptable step height is incompatible with the circuit requirements.

This metal cracking problem is particularly acute in the fabrication of silicon-gate field effect integrated circuits, due to the requirement of relatively thick insulator films and the desire to cross silicon strips covered with insulators with metallic conductors. In silicon-gate devices the gate electrode is fabricated with polycrystalline silicon instead of aluminum as in metal-oxide-silicon devices, thereby resulting in greater switching speeds and lower threshold voltages. Another advantage which accrues during fabrication of the silicon-gate structure is self-alignment of the gate with the drain and source. These and other advantages result in a size reduction capability on the order of 50% for silicon-gate integrated circuits, as compared with conventional MOS integrated circuits, thereby allowing more circuit elements to be formed on a single semiconductor chip and intensifying contact reliability problems due to cracking of the conductive films. The present invention is directed toward increasing the reliability and production yield of integrated circuit devices by providing a simple and effective solution to the aforementioned metal cracking problem.

SUMMARY OF THE INVENTION

The present invention technique is applicable in the fabrication of a semiconductor device wherein an insulating, protective or passivating layer (e.g. silicon oxide) is established on the surface of a body of semiconductor material, the layer having abrupt contours such as an aperture therethrough to expose a portion of the semiconductor surface to which it is desired to establish an electrical contact. The electrical contact is formed by a conductive film contacting the exposed semiconductor surface and overlying portions of the protective layer. Briefly, the invention comprises heating the overlying protective layer prior to forming the conductive film, in the presence of a glass former having a melting point lower than that of the protective layer (e.g. silicon oxide), sufficiently to form a glass layer on the protective layer and to cause plastic flow of the glass at the abrupt surface contours to round off or dull the sharp edges and eliminate the stress points which would cause a cracking tendency upon subsequent formation of the metallic film.

The glass layer can be formed by depositing the glass former on the protective layer prior to heating, by heating the protective layer in an atmosphere containing atoms of the glass former, or by forming a doped glass layer on the protective layer prior to formation of the apertures.

DESCRIPTION OF THE PREFERRED EMBODIMENT

Figure 1:
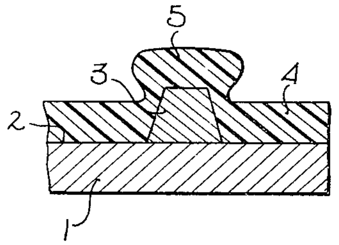
FIG. 1 is a partial cross-section view, in elevation of a film member on a substrate with a deposited layer thereover.
Figure 2:
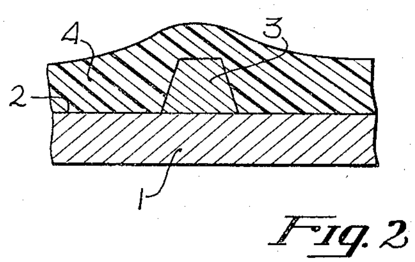
FIG. 2 is a partial cross-section view of the film member and layer thereover after employing one embodiment of the invention.

Broadly, the invention involves an insulator layer for micro electronic applications wherein the insulator readily acepts or includes (e.g. inheretly or by addition) a glass former and forms a glass at a low melting temperature relative to the melting point of a conductor or other circuit element formed adjacent the insulator. In forming the glass, abrupt contours of the insulator are rounded or smoothed to form gradual surface transitions. This concept is generally shown in FIGS. 1 and 2. In FIG. 1, there is shown a substrate 1 having a surface 2 receiving a circuit component 3. The circuit component 3 may take the form of a resistor, conductor, interconnect, gate, active element or other components. Deposited over the component 3 is an insulator or passivating layer 4 which may be any layer that accepts a glass forming material to form a low melting glass such as silicon dioxide. When the insulator 4 is pyrolytically deposited over a component 3, the insulator layer 4 often forms a mushroom like protrusion or surface contour 5. It should be readily apparent that it is most difficult to deposit another film over such a surface. An attempt to form another film thereover is likely to result in a cracking problem. To avoid this problem, prior to the deposition of a film over insulator layer 4, the insulator layer is heated to form a glass. The glass must be formed at a temperature which does not substantially affect component 3 or substrate 1. The glass may be formed by the addition of a glass former to the insulator layer 4 or by forming the insulator 4 with a glass former therein. It may also be possible to out diffuse a glass former from the substrate 1 or component 3.

It has been found that once the glass former has become a part of insulator 4, the heating to form the glass will result in a changing of the surface contour in a manner similar to that shown in FIG. 2. It can be seen that the mushroom-like protrusion 5 has been greatly minimized and contours have been formed that are compatible with the deposition or forming of another layer over the insulator 4. It has been found that this step of heating to form a glass minimizes the cracking problem and improves reliability and yield.

The present invention technique will now be described with reference to the fabrication of a silicon-gate field effect transistor, which may be a part of an integrated circuit formed on a silicon chip, although it is understood that the disclosed technique is applicable in the fabrication of any semiconductor device wherein a conductive metallic, or other thin film is to be established covering abrupt surfaces or apertured portions of a layer.

Figure 3:
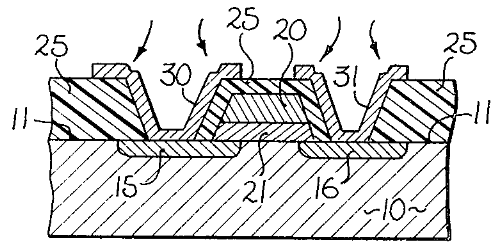
FIG. 3 is a partial cross-section view, in elevation, of a silicon-gate field effect transistor fabricated in accordance with prior art techniques.

Turning first to FIG. 3, a typical silicon gate field effect transistor is shown, employing a silicon substrate 10 having a source electrode 15 and a drain electrode 16 diffused into upper surface 11. Gate oxide 21 is grown prior to deposition of a polycrystalline silicon gate electrode 20, and a silicon dioxide layer 25 is etched away to form apertures exposing portions of the upper surface of the substrate 10 so that the source and drain regions may be formed by a diffusion step. An oxide film is then deposited over the entire surface of the substrate. The openings are then etched in the oxide to permit connection to the source and drain. A conductive film 30 (e. g. polycrystalline silicon) is formed over at least a portion of the source region 15, and covering parts of the exposed semiconductor surface areas and adjacent portions of layer 25. Likewise, a conductive film 31 is formed over the drain region 16. This type of structure and various methods for forming it are well known in the art and hence will not be discussed in greater detail.

The films 30 and 31 are subject to cracking (as indicated by the arrows) at stress points formed by the relatively sharp aperture edges defined by the etched away portions of the layer 25, this cracking tendency being a disadvantageous feature of the illustrated prior art structure.

Figure 4:
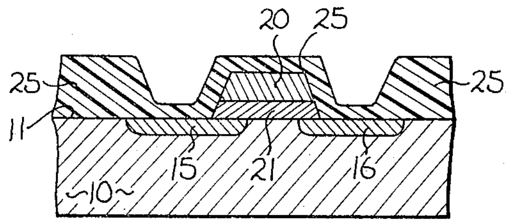
FIG. 4 is a partial cross-section view, in elevation, of a silicon-gate field effect transistor in an intermediate stage of production in accordance with prior art techniques.
Figure 5:
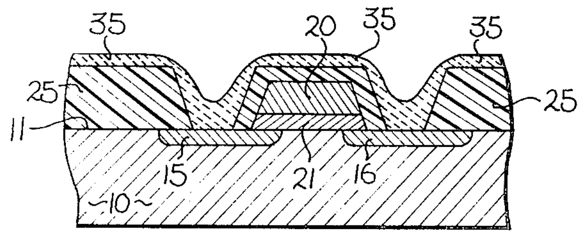
FIG. 5 shows the device of FIG. 4 in a subsequent stage of production in accordance with the present invention technique.
Figure 6:
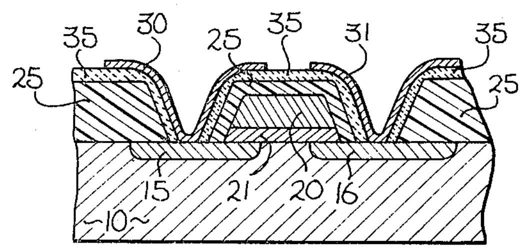
FIG. 6 shows the completed device.

FIGS. 4–6 depict the present invention fabrication technique, with FIG. 4 showing the prior art structure of FIG. 3 before metalizing, with like reference numerals indicating similar structure throughout. It is at this point in the device fabrication that the present invention technique may depart from the prior art fabrication technique.

The next process step is to establish on the silicon oxide (insulating) layer 25, a covering glass layer such as a phosphorus doped silicon oxide having a lower melting point than the underlying component and the formed insulating layer. To establish this glass layer any glass former (e.g. phosphorus, boron, zinc, lead) having a melting point lower than that of the insulating layer and the underlying component can be utilized. Should such a glass former be present as a result of a prior fabrication step then merely heating will suffice to form the desired glass layer. Otherwise, the glass former must be introduced, such as by pyrolytic deposition of a dopant. It should be understood that the insulating layer and glass former should be selected to form a compatible system and that it is not necessary to add a glass former to certain systems. For example, arsenic sulfide requires no additional glass former but functions as an insulating layer and forming a glass when heated. Certain halides (e.g. a, Na, K etc.) may also be employed.

Upon formation of the glass layer, heating is continued to approach the melting point of the glass layer so that plastic flow of the glass layer at the sharp aperture edges will occur to round off or dull such steep surface contours. The underlying insulating layer maintains the formed pattern. The device then appears as shown in FIG. 5, the glass layer being indicated by the reference numeral 35.

The final step in the present invention process is metalizing in the normal manner, the device then appearing as shown in FIG. 6. Due to the rounded edges of the doped glass layer 35, there are no stress points created at the aperture edges and the films 30 and 31 are smooth and without cracks.

Although the present invention process has been described with a certain degree of particularity in accordance with the presently preferred embodiment, the present disclosure has been made only by way of example and that various changes may be resorted to without departing from the spirit and the scope of the invention as hereinafter claimed. For example, the desired doped glass may be formed by heating in an atmosphere containing atoms of the glass former, with or without prior deposition of the glass former, or by doping the surface of the silicon oxide glass layer prior to forming the apertures. The etched holes to connect to the source and drain may be formed before or after the formation of layer 35.

I claim:

1. In the fabrication of a field effect semiconductor device wherein an insulating layer is established on the surface of a body of semiconductor material, and having abrupt surface contours over which is established, at least in part, an interconnect film, the improvement comprising: prior to forming said interconnect film, heating of said insulating layer in the presence of a glass former to cause controlled plastic flow of said glass at the abrupt surface contours to smooth said contours and not substantially adversely affect said devices.

2. The fabrication of a semiconductor device as defined in Claim 1 wherein said heating is to a temperature that maintains any pattern formed by said insulating layer.

3. The fabrication of a semiconductor device as defined in Claim 2 wherein said body of semiconductor material is substantially unaffected by said heating.

4. The fabrication of a semiconductor device as defined in Claim 3 wherein said insulating layer comprises silicon oxide.

5. The fabrication of a semiconductor device as defined in Claim 4 wherein atoms of said glass formers are deposited upon said oxide layer prior to heating of said oxide layer.

6. The fabrication of a semiconductor device as defined in Claim 4 wherein said glass former forms a glass layer having a melting point lower than said oxide.

7. The fabrication of a semiconductor device as defined in Claim 4 wherein said oxide layer is heated in an atmosphere containing atoms of said glass former.

8. The fabrication of a semiconductor device as defined in Claim 4, wherein an oxide layer containing atoms of said glass former is established on said silicon oxide layer prior to formation of said surface contours.

9. The fabrication of a semiconductor device as defined in Claim 1 wherein said glass former is phosphorus.

10. The fabrication of a semiconductor device as defined in Claim 9 wherein said semiconductor device is a silicon gate field effect transistor, said body of semiconductor material being silicon.

11. The fabrication of a semiconductor device as defined in Claim 9 wherein said phosphorus atoms are pyrolytically deposited upon said oxide layer.

12. The fabrication of a semiconductor device as defined in Claim 4, wherein said oxide layer is heated in a phosphorus atom containing atmosphere.

13. The fabrication of a semiconductor device as defined in Claim 4 wherein a phosphorus doped oxide layer is established on said silicon oxide layer prior to formation of said aperture.

14. The fabrication of a semiconductor device as defined in Claim 4 wherein said surface contours are apertures in the oxide which expose semiconductor and said film is a conductive film.

15. The fabrication of a semiconductor device as defined in Claim 14 wherein said conductive film is aluminum.

16. The fabrication of a semiconductor device as defined in Claim 1 wherein a conductive film is formed under said insulating layer and said surface contours are the result of said insulating layer being formed over said underlying conductive film.

17. The fabrication of a semiconductor device as defined in Claim 16 wherein said underlying conductive film is polycrystalline silicon.

18. In the fabrication of a field effect device, the method comprising forming a thick field oxide over a portion of a silicon substrate; removing a portion of said thick oxide in areas wherein a field effect device is to be formed; forming a thin gate oxide in said areas where said field effect device is to be formed; forming a gate material over said thin gate oxide and exposing a portion of said substrate in the vicinity of said thick field oxide and said thin gate oxide and said overlying gate material; diffusing impurity into said exposed substrate to form source and drain regions; forming a glass layer over at least a portion of said device, said layer exposing said source and drain regions; heating said glass layer to smooth abrupt contours over which said glass layer is formed and depositing a metal layer over a portion of said glass layer and to make contact with at least a portion of said source and drain regions and said gates.

19. The method defined in Claim 18 wherein said gate layer is silicon.

References Cited

UNITED STATES PATENTS

| | | | |
|---|---|---|---|
| 3,340,445 | 9/1967 | Scott, Jr. et al. | 317—235 X |
| 3,309,245 | 3/1967 | Haenichen | 317—235 X |
| 3,247,428 | 4/1966 | Perri et al. | 117—212 X |

RALPH S. KENDALL, Primary Examiner

U.S. Cl. X.R.

156—17; 317—235 A, 234 R